(12) United States Patent
Seddon

(10) Patent No.: US 10,770,351 B2
(45) Date of Patent: *Sep. 8, 2020

(54) SEMICONDUCTOR SUBSTRATE PRODUCTION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/581,964

(22) Filed: Sep. 25, 2019

(65) Prior Publication Data

US 2020/0020586 A1 Jan. 16, 2020

Related U.S. Application Data

(63) Continuation of application No. 15/994,864, filed on May 31, 2018, now Pat. No. 10,468,304.

(51) Int. Cl.
*H01L 21/00* (2006.01)
*H01L 21/78* (2006.01)
*C30B 29/36* (2006.01)
*B23K 26/53* (2014.01)
*B23K 101/40* (2006.01)

(52) U.S. Cl.
CPC .......... *H01L 21/7806* (2013.01); *B23K 26/53* (2015.10); *C30B 29/36* (2013.01); *B23K 2101/40* (2018.08)

(58) Field of Classification Search
CPC . H01L 21/7806; B23K 26/53; B23K 2101/40; C30B 29/36
See application file for complete search history.

(56) References Cited

U.S. PATENT DOCUMENTS

| | | |
|---|---|---|
| 6,780,243 B1 | 8/2004 | Wang et al. |
| 9,481,051 B2 | 11/2016 | Hirata et al. |
| 9,620,415 B2 | 4/2017 | Hirata et al. |
| 9,808,884 B2 | 11/2017 | Hirata et al. |
| 9,815,138 B2 | 11/2017 | Hirata |
| 9,868,177 B2 | 1/2018 | Hirata |
| 9,878,397 B2 | 1/2018 | Hirata et al. |

(Continued)

FOREIGN PATENT DOCUMENTS

| | | |
|---|---|---|
| JP | 2001-341122 A | 12/2001 |
| JP | 2016-146446 A | 8/2016 |

(Continued)

*Primary Examiner* — Richard A Booth
(74) *Attorney, Agent, or Firm* — Adam R. Stephenson, Ltd.

(57) ABSTRACT

Implementations of a method of separating a wafer from a boule including semiconductor material may include: creating a damage layer in a boule comprising semiconductor material. The boule may have a first end and a second end. The method may include cooling the first end of the boule and heating the second end of the boule. A thermal gradient may be formed between the cooled first end and the heated second end. The thermal gradient may assist a silicon carbide wafer to separate from the boule at the damage layer.

20 Claims, 2 Drawing Sheets

(56) References Cited

U.S. PATENT DOCUMENTS

| | | |
|---|---|---|
| 10,468,304 B1 * | 11/2019 | Seddon ............... C30B 29/36 |
| 2006/0254505 A1 | 11/2006 | Tsvetkov et al. |
| 2016/0228984 A1 | 8/2016 | Hirata et al. |
| 2016/0228985 A1 | 8/2016 | Hirata et al. |
| 2016/0288250 A1 | 10/2016 | Hirata et al. |
| 2016/0288251 A1 | 10/2016 | Hirata et al. |
| 2016/0293397 A1 | 10/2016 | Hirata et al. |
| 2016/0305042 A1 | 10/2016 | Hirata |
| 2016/0307763 A1 | 10/2016 | Hirata |
| 2016/0354862 A1 | 12/2016 | Hirata |
| 2017/0015017 A1 | 1/2017 | Hirata |
| 2017/0025275 A1 | 1/2017 | Hirata et al. |
| 2017/0025276 A1 | 1/2017 | Hirata |
| 2017/0053829 A1 | 2/2017 | Hirata et al. |
| 2017/0066078 A1 | 3/2017 | Morikazu et al. |
| 2017/0136572 A1 | 5/2017 | Hirata |
| 2017/0151627 A1 | 6/2017 | Hirata |
| 2017/0198411 A1 | 7/2017 | Hirata |
| 2017/0291255 A1 | 10/2017 | Hirata |
| 2017/0348796 A1 | 12/2017 | Nishino et al. |
| 2017/0352781 A1 | 12/2017 | Obuchi et al. |

FOREIGN PATENT DOCUMENTS

| | | |
|---|---|---|
| JP | 2016-146447 A | 8/2016 |
| JP | 2016-146448 A | 8/2016 |
| JP | 2016-151457 A | 8/2016 |
| JP | 2016-197698 A | 11/2016 |
| JP | 2016-197699 A | 11/2016 |
| JP | 2016-197700 A | 11/2016 |
| JP | 2016-198788 A | 12/2016 |
| JP | 2016-207702 A | 12/2016 |
| JP | 2016-207703 A | 12/2016 |
| JP | 2016-225535 A | 12/2016 |
| JP | 2016-225536 A | 12/2016 |
| JP | 2017-005008 A | 1/2017 |
| JP | 2017-022283 A | 1/2017 |
| JP | 2017-024014 A | 2/2017 |
| JP | 2017-024039 A | 2/2017 |
| JP | 2017-024188 A | 2/2017 |
| JP | 2017-028072 A | 2/2017 |
| JP | 2017-041481 A | 2/2017 |
| JP | 2017-041482 A | 2/2017 |
| JP | 2017-057103 A | 3/2017 |
| JP | 2017-092314 A | 5/2017 |
| JP | 2017-121742 A | 7/2017 |
| JP | 2017-123405 A | 7/2017 |
| JP | 2017-188586 A | 10/2017 |
| JP | 2017-189870 A | 10/2017 |
| JP | 2017-215303 A | 12/2017 |
| JP | 2017-216423 A | 12/2017 |
| JP | 2017-216424 A | 12/2017 |
| JP | 2017-220631 A | 12/2017 |

* cited by examiner

SEMICONDUCTOR SUBSTRATE PRODUCTION SYSTEMS AND RELATED METHODS

CROSS REFERENCE TO RELATED APPLICATIONS

This application is a continuation application of the earlier U.S. Utility Patent Application to Michael J. Seddon entitled "Semiconductor Substrate Production Systems and Related Methods," application Ser. No. 15/994,864, filed May 31, 2018, now pending, the disclosure of which is hereby incorporated entirely herein by reference.

BACKGROUND

1. Technical Field

Aspects of this document relate generally to methods for forming semiconductor substrates from a boule.

2. Background

Semiconductor substrates may be formed through separation from a larger portion of semiconductor material (a boule) formed using various processing techniques. In some forming techniques, the boule is formed to have a unitary crystal structure throughout (single crystal) ensuring that all of the semiconductor substrates formed from the boule have the same crystalline structure.

SUMMARY

Implementations of a method of separating a wafer from a boule including semiconductor material may include: creating a damage layer in a boule semiconductor material with a first end and a second end. The method may include cooling the first end of the boule and heating the second end of the boule. A thermal gradient may be formed between the cooled first end and the heated second end of the boule and may assist a silicon carbide wafer to separate from the boule at the damage layer.

Implementations of a method of separating a wafer from a boule of silicon carbide may include one, all, or any of the following:

The damage layer may be created through laser irradiation.

Cooling the first end of the boule and heating the second end of the boule may occur simultaneously. The second end of the boule may be heated through contacting a heating chuck.

Heating the second end of the boule may include applying pulses of heat using a heating chuck.

Cooling the first end of the boule may further include contacting the first end of the boule with liquid nitrogen. Heating the second end of the boule may further include applying a hot liquid to the second end of the boule.

Cooling the first end of the boule may further include contacting the first end of the boule with liquid nitrogen and heating the second end of the boule may further include rapidly immersing the second end of the boule into a hot liquid.

The method may also include placing the second side of the boule on a heating chuck and peeling, prying, or twisting the first end of the boule with a grip while applying heat to the second side of the boule.

Implementations of a method of separating a wafer from a boule of silicon carbide may include: creating a damage layer in a boule of silicon carbide having a first end and a second end. The method may also include applying a material onto the second end of the boule and cooling the first end of the boule. The method may include heating the material at the second end of the boule. A thermal gradient may be caused by heating the second end of the boule and cooling the first end of the boule. The thermal gradient may assist a silicon carbide wafer to separate from the boule at the damage layer.

Implementations of a method of separating a wafer from a boule of silicon carbide may include one, all, or any of the following:

The damage layer may be created through laser irradiation.

The material may increase thermal conduction to the second end of the boule.

Cooling the first end of the boule and heating the material at the second end of the boule may occur simultaneously and the material at the second end of the boule may be heated through contacting a heating chuck and heating rapidly.

Heating the second end of the boule may include applying pulses of heat through a heating chuck.

Cooling the first end of the boule may further include contacting the first end of the boule with liquid nitrogen and heating the second end of the boule may further include applying a hot liquid to the second end of the boule.

Cooling the first end of the boule may further include contacting the first end of the boule with liquid nitrogen and heating the second end of the boule may further include rapidly immersing the second end of the boule into a hot liquid.

The method may further include placing the second side of the boule on a heating chuck and peeling, prying, or twisting the first end of the boule with a grip while applying heat to the second side of the boule.

Implementations of a method of separating a wafer from a boule of silicon carbide may include: creating a damage layer in a boule of silicon carbide. The boule may have a first end and a second end. The method may include cooling the first end of the boule by contacting with liquid nitrogen and heating the second end of the boule. The method may include creating a thermal gradient between the first end and the second end of the boule through the simultaneous heating of the first end of the boule and cooling of the second end of the boule. The method may include mechanically separating a silicon carbide wafer from the boule at the damage layer.

Implementations of a method of separating a wafer from a boule of silicon carbide may include one, all, or any of the following:

The second end of the boule may be contacted to a heating chuck and heated rapidly.

Heating the second end of the boule may further include applying pulses of heat through a heating chuck.

Heating the second end of the boule may further include applying a hot liquid to the second end of the boule.

Heating the second end of the boule may further include immersing the second end of the boule into a hot liquid.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 2:
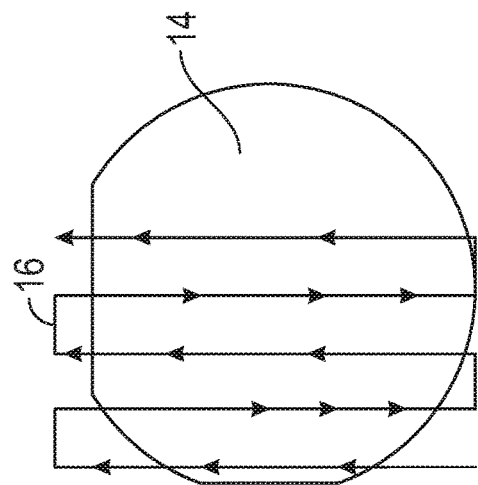
FIG. 2 is a top view of an implementation of a method for forming a damage layer in a boule of silicon carbide.

This disclosure, its aspects and implementations, are not limited to the specific components, assembly procedures or method elements disclosed herein. Many additional components, assembly procedures and/or method elements known in the art consistent with the intended optimization of semiconductor substrate production systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such optimization of semiconductor substrate production systems and methods, and implementing components and methods, consistent with the intended operation and methods.

Single crystal silicon carbide is a wide bandgap semiconductor material with physical and chemical properties that are well suited for high power microwave, temperature tolerant, and radiation resistant uses. Silicon carbide exhibits a critical electric-field breakdown strength that is about ten times greater than the electric field breakdown of silicon. Silicon carbide also has a high-field electron velocity similar to gallium nitride. Also silicon carbide shows a thermal conductivity similar to copper which is higher than either silicon or gallium arsenide. This characteristic makes silicon carbide an excellent material for certain semiconductor based devices such as monolithic microwave integrated circuits (MMIC), field effect transistors (FET), and other power devices.

Silicon carbide for use in semiconductor devices is often prepared as a large single crystal. Silicon carbide is formed of equal parts silicon and carbon through covalent bonding. This process leads to a highly ordered configuration that is extremely hard. The hardness of silicon carbide makes it costly to cut and thin wafers/substrates from a silicon carbide boule or ingot because the saws used for cutting silicon carbide wear out quickly. Cutting a silicon carbide boule using a laser damage process may increase efficiency of preparing wafers of silicon carbide. The lasers are used to create damage layers below a surface of the boule to remove a wafer of silicon carbide. An example of such a method that utilizes laser induced damage is as the method marketed under the tradename KABRA by DISCO Corporation of Tokyo, Japan.

Thermal gradients can be applied to a silicon carbon boule to create a stress or to shock an embedded damage layer in the boule. The stress on the embedded damage layer may create or propagate a crack through the material of the damage layer which may aid in removing a wafer from the boule. The top portion of the boule including the damage layer may then be separated from the rest of the boule as a substrate. After the thermal treatment, the top portion may be removed mechanically or may separate purely through thermal forces caused by the pressure of the temperature change in the boule.

When the boule has been thinned through removal of substrates to the point where there are just a few substrates left in it, completion of the separation process can be very difficult as it can be difficult to create a significant thermal gradient between a first side of the boule and a second side of the boule. At the end of the boule the stresses used to create and propagate a crack through the damage layer may not be adequate to separate a wafer from the boule when the boule is too thin. Therefore the lower portion or end of the boule remains unusable even though several more substrates could be formed from the material at the end of the boule. Various methods to enhance the thermal gradient between the first end of the boule and the second end of the boule may help to optimize/increase the number of wafers that can be singulated from a boule.

A wide variety of semiconductor substrate types exist and are used in the process of manufacturing semiconductor devices. Non-limiting examples of semiconductor substrates that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate type useful for constructing semiconductor devices. Particular implementations disclosed herein may utilize silicon carbide semiconductor substrates (silicon carbide substrates) of any polytype. In this document the term "wafer" is also used along with "substrate" as a wafer is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations. Any of the system and/or method implementations disclosed in this document may be utilized with any of the semiconductor substrate types disclosed in this document.

Figure 1:
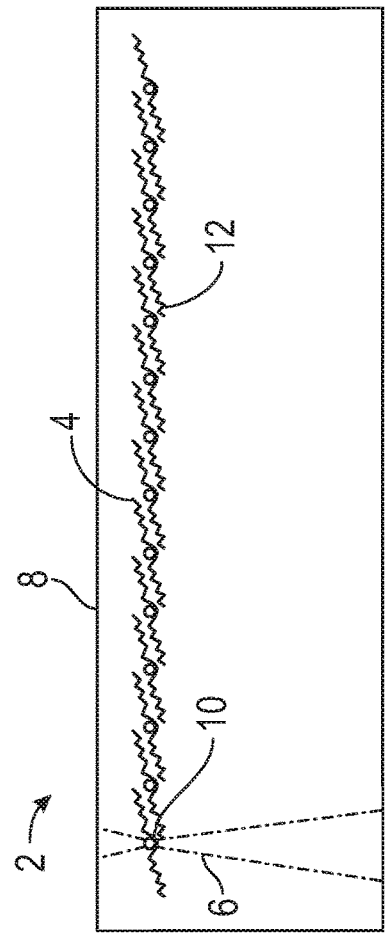
FIG. 1 is a side view of an implementation of a method for forming a damage layer in a boule of silicon carbide.

Referring to FIG. 1, a portion of a semiconductor boule 2 containing a damage layer 4 is illustrated. As illustrated, a laser beam 6 is irradiating the first surface 8 of the semiconductor boule. A focal point 10 of the laser beam 6 is set so that it is located within the semiconductor substrate below the first surface 8. The wavelength of the laser light 6 used to irradiate the first surface 8 is one for which the material of the particular semiconductor substrate is at least partially optically transmissive, whether translucent or transparent. The focal point 10 creates a damage area 4 in the boule at and around the focal point 10. The degree of damage is determined by many factors, including, by non-limiting example, the power of the laser light, the duration of exposure of the material, the absorption of the material of the substrate, the crystallographic orientation of the substrate material relative to the direction of the laser light, the atomic structure of the substrate, and any other factor regulating the absorbance of the light energy and/or transmission of the induced damage or heat into the substrate.

The portion of the boule 2 illustrated in FIG. 1 is a silicon carbide (SiC) substrate, and so the laser light wavelength that may be employed may be any capable of transmitting into the SiC substrate material. In particular implementations, the wavelength may be 1064 nm. In various implementations, the laser light source may be a Nd:YAG pulsed laser or a YVO4 pulsed laser. In one implementation where a Nd:YAG laser is used, a spot size of 10 microns and an average power of 3.2 W may be used along with a repetition frequency of 80 kHz, pulse width of 4 ns, numerical aperture (NA) of the focusing lens of 0.45. In another implementation, a Nd:YAG laser may be used with a repetition frequency of 400 kHz, average power of 16 W, pulse width of 4 ns, spot diameter of 10 microns, and NA of 0.45. In various implementations, the power of the laser may be varied from about 2 W to about 4.5 W. In other implementations, however, the laser power may be less than 2 W or greater than 4.5 W.

As illustrated, the focal point 10 of the laser light forms a location of rapid heating and may result in full or partial melting of the material at the focal point 10. The point of rapid heating and the resulting stress on the hexagonal single crystal structure of the SiC substrate results in cracking of the substrate material along a c-plane of the substrate. Depending on the type of single SiC crystal used to manufacture the boule, the c-plane may be oriented at an off angle to the second surface of about 1 degree to about 6 degrees. In various implementations, this angle is determined at the time the boule is manufactured. In particular implementations, the off angle may be about 4 degrees.

During operation, the laser is operated in pulsed operation to create numerous overlapping spots of pulsed light while passing across the surface of the substrate. As a result, a continuous/semi-continuous layer/band of modified material is formed within the wafer. In other implementations, the laser may be operated in continuous wave mode rather than pulsed mode to create the band of modified material. As illustrated, the stress caused by the focal point 12 causes cracking along the c-plane in the material of the SiC substrate 2 in one or both directions along the c-plane or in both directions. These cracks are illustrated as spreading from the focal point 10 area (where the modified layer/band is located) angled at the off angle in FIG. 1. In various implementations, the cracks may be located below the focal point 10, above the focal point 10, or spread directly from the focal point 10, depending on the characteristics of the laser and the method of application of the laser to the material. In various implementations, the length of the cracks into the substrate is a function of the power of the laser applied. By non-limiting example, the depth of the focal point was set at 500 um into the substrate; where the laser power was 3.2 W, the crack propagation from the modified layer/band was about 250 um; where the laser power was at 2 W, the crack lengths were about 100 um; where the laser power was set at 4.5 W, the crack lengths were about 350 um.

As illustrated in FIG. 2, the boule 2 can be indexed below the laser beam 6 (or the laser beam 6 can be indexed above the boule 2, or both can be indexed together) to produce a plurality of spaced apart locations 12 where damage has been induced in the substrate. The width between the plurality of spaced apart locations can be a function of the crack lengths into the material of the wafer, and/or the amount of damage layer formed as a wafer is initially scanned. By non-limiting example, the width may be set between about the length of the cracks into the wafer to about twice the length of the cracks into the wafer. In situations where the damage layer is being initially formed during scanning over the wafer on one side of the wafer, the width between the spaced apart locations can be initially reduced. By non-limiting example, initially the width may be set to 200 um until the cracks begin to spread from the modified layer, at which point the width (index amount) may be set to 400 um. The feed speed of the wafer under the laser (or the laser above the wafer) may be, by non-limiting example, 400 mm/second, though slower or faster feed speeds may be used in various implementations.

While a plurality of spaced apart locations 12 are illustrated, in various implementations, the laser beam 6 may not be applied in an indexed manner, but may be applied in a continuous or substantially continuous manner to the material of the substrate to create continuous or substantially continuous zones/areas of damage in the substrate. These areas of damage may include corresponding continuous cracking or discontinuous cracking of the substrate material. The plurality of spaced apart locations 12 or the continuous lines/areas affected by the laser irradiation form a damage layer within the semiconductor substrate after the laser has completed indexing/passing over the semiconductor substrate material.

Referring to FIG. 2, a diagram of a silicon carbide wafer 14 with an alternating single pass laser irradiation path 16 (single pass path) is illustrated. This figure is used to illustrate another method of preparing a wafer to singulate from a boule using a laser. The particular semiconductor substrate illustrated here has two wafer flats that correspond with an SiC wafer, though the principles disclosed herein could be applied to many different substrate types. As illustrated, a path 16 followed by a laser as it irradiates the substrate with laser light is illustrated, with the path 16 indicating locations where the light irradiation occurs and a focal point within the substrate is formed. In other implementations however, the path 16 may illustrate the path of the laser as it travels across the surface of the substrate irradiating the wafer in continuous wave rather than pulsed mode operation. The path 16 illustrated in FIG. 2 is an alternating single pass path, where the laser indexes across the wafer first in the y direction, over in the x direction, and then indexes in the opposite y direction in various steps across the wafer. In various implementations, the spacing of steps in the x direction may be the same, as illustrated in FIG. 2. In other implementations, however, the spacing of steps may vary across the wafer, either for an initial period, or for the entire distance across the wafer in the x direction, depending on how the damage layer forms. The spacing of the steps may be any disclosed in this document.

In various implementations, however, multi pass paths and paths that do not involve just straight lines (spirals, etc.) may be utilized in various implementations. Likewise, more than one laser beam may be employed in various implementations scanned in the same or different directions along the substrate.

Figure 3:
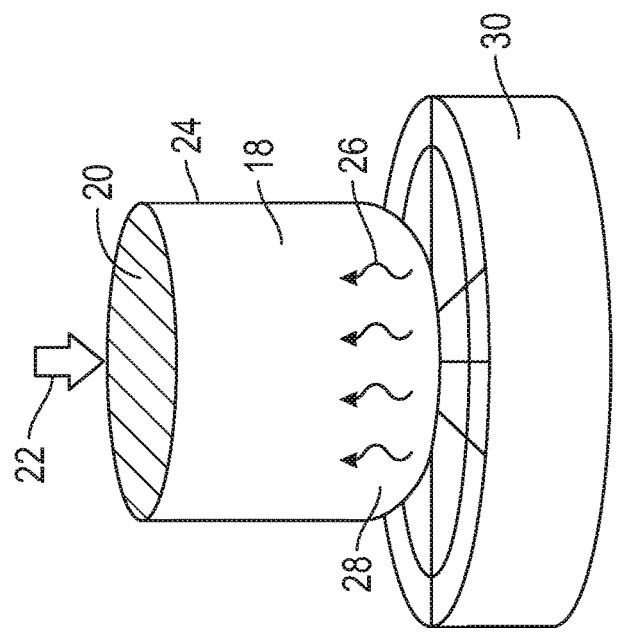
FIG. 3 is a side perspective view of an implementation of a system for cooling a first end of a boule and heating a second end of a boule.

Referring to FIG. 3, an implementation of a system employing a method of creating a thermal gradient in a boule 18 of silicon carbide is illustrated. The method may include creating a damage layer 20 in the boule 18 through laser irradiation using a process illustrated in FIGS. 1-2. The damage layer 20 may also be created through any other method described in this document. The method then includes cooling 22 a first end 24 of the boule 18 and heating 26 a second end 28 of the boule 18. In various implementations cooling, of the boule includes cooling to a temperature around −196° C. using boiling liquid nitrogen. In some implementations heating the boule includes heating to a temperature of around 100° C. Heating and cooling the boule creates a temperature gradient in the boule 18 and may assist with propagating the damage layer through the width of the boule 18. In some implementations of a method of separating a wafer from a boule of silicon carbide, creating a thermal gradient in the boule 18 may include cooling 22 the first end 24 of the boule 18 and heating 26 the second end 28 of the boule 18 simultaneously. As illustrated, in various system implementations, the heating of the second end 28 of the boule may be carried out through placing the boule 18 on a heating chuck 30. In various implementations, the heating 26 of the boule 18 may include applying pulses of heat (time varying heat flux) to the boule using the heating chuck 30. In other implementations, heating the second end of the boule may include applying a constant heat flux (substantially time unvarying heat flux) to the second end 28 of the boule 18. In still other implementations, heating the second end 28 of the boule 18 may include heating while rapidly heating the heating chuck. By non-limiting example, rapidly heating may include heating at a rate of 40-100° C./second. In various implementations, the boule 18 may be placed on the heating chuck 30 before cooling 22 the first end 24 of the boule 18 begins.

Figure 4:
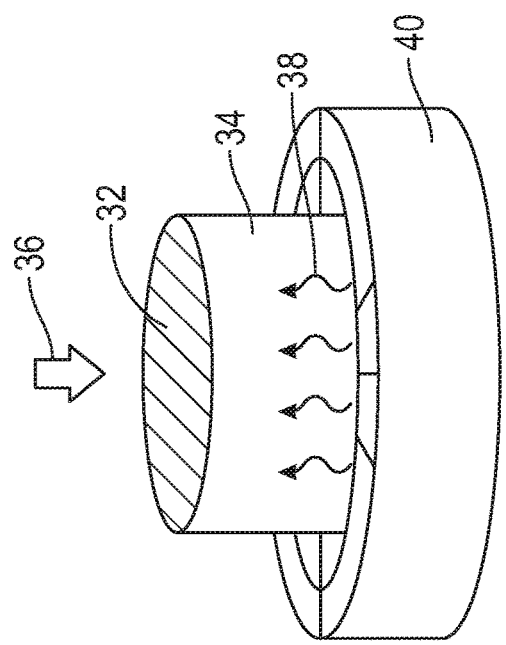
FIG. 4 is a side perspective of an implementation of a system for cooling a first end of a wafer and heating a second end of a wafer.

Referring to FIG. 4, another implementation of a system employing a method of separating a wafer from a boule of silicon carbide is illustrated. As previously described, all methods described herein may begin with forming a damage layer 32 in the boule and/or wafer 34 before forming/applying a temperature gradient to the boule and/or wafer 34. The method may include cooling 36 the wafer 34 of silicon carbide before applying heat 38 to the wafer. In various implementations, the heat 38 may then be applied by applying heat pulses through a heating chuck 40.

Figure 5:
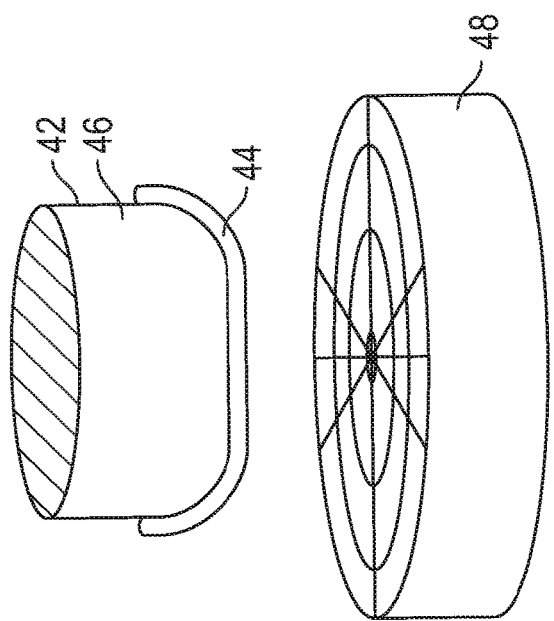
FIG. 5 is a side perspective view of an implementation of a material coupled to a second end of a boule.

Referring to FIG. 5, an additional implementation of a method of separating a wafer from a boule 42 of silicon carbide is illustrated. The method may include applying a material 44 onto the second end 46 of the boule 42. The material 44 may include any material/substance capable of facilitating thermal conduction to the second end of the boule including, by non-limiting example, rubber coatings, temporary or permanent gels, or thermally conductive pastes or gels. In various implementations, the boule may be cooled before applying the material. In other implementations, the material may be applied to boule before cooling the first end of the boule. After applying the material, heating and cooling of the boule may include any method described in this document such as by non-limiting example heating the second end of the boule through a heating chuck 48 using any of the approaches disclosed in this document.

Figure 6:
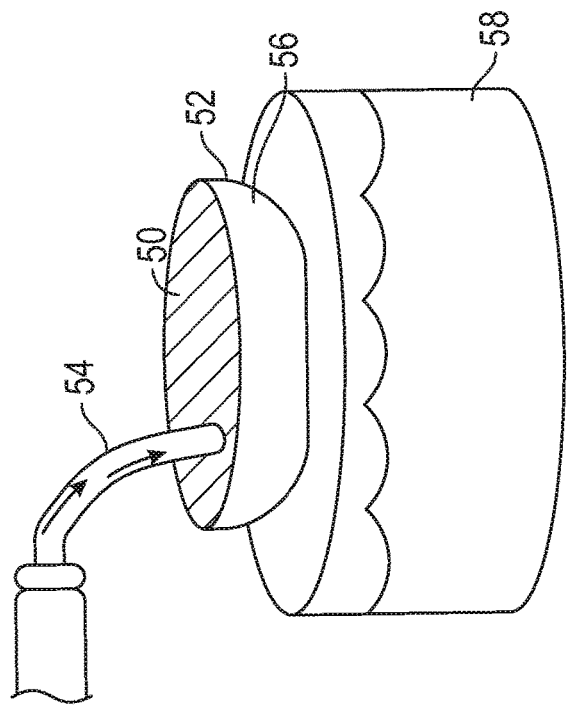
FIG. 6 is a side perspective view of an implementation of a system for pouring liquid nitrogen on a first end of a boule.
Figure 7:
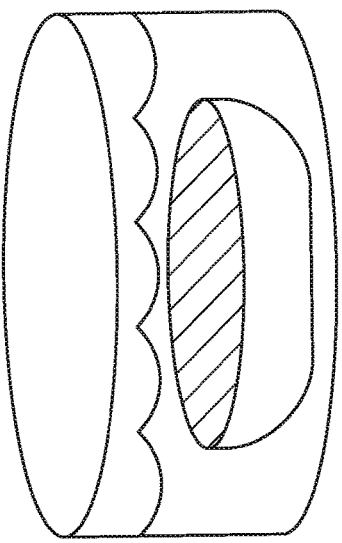
FIG. 7 is a side perspective see through view of an implementation of a boule immersed in a liquid.

Referring to FIG. 6, an additional method of creating a thermal gradient in a boule of semiconductor material is illustrated. This method includes cooling the first end 50 of the boule 52 through contacting the first end of the boule with liquid nitrogen 54. In other implementations (as in others disclosed in this document), other cooling liquids/gases/solids may be used. The method may also include heating the second end 56 of the boule 52 by applying a hot liquid 58 to the second end 56 of the boule 52. As illustrated, applying a hot liquid 58 to the second end 56 of the boule 52 may include placing the boule in a hot water bath or other bath containing any other heated liquid. In other implementations, the hot liquid may be poured onto the second end of the boule. Referring to FIG. 7, in various implementations, the method may include rapidly immersing the boule after cooling into the hot liquid in the bath (quenching).

Figure 8:
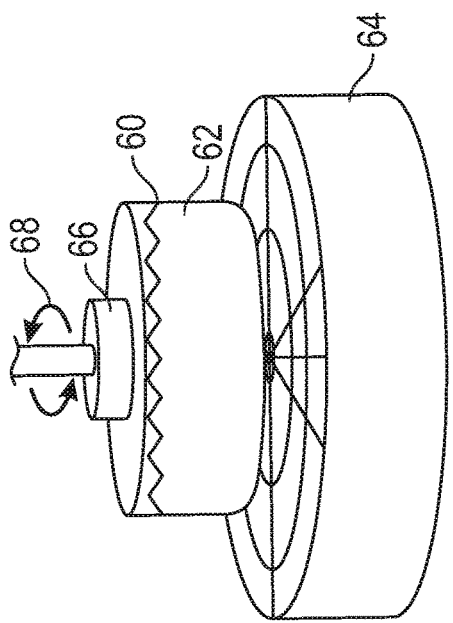
FIG. 8 is a side perspective view of an implementation of a grip for twisting a top surface of a boule of silicon carbide with a damage layer therein.

Referring to FIG. 8, another implementation of a system utilizing a method of separating a wafer from a boule of silicon carbide is illustrated. The method includes creating a damage layer 60 in a boule 62 of silicon carbide, cooling a first end of the boule, and heating the second end of the boule. Cooling of the boule may include any process/system disclosed in this document such as by non-limiting example, contacting with liquid nitrogen or other cooling liquids, applying cold gas to the first end of the boule, or other suitable methods for cooling a boule of semiconductor material relative to an original temperature of the boule. In various implementations, methods of cooling the boule may include cooling the boule rapidly at a rate of approximately 40-100° C./second. Heating the boule may include any process/system disclosed in this document, including, by non-limiting example, applying heat through a heat chuck, immersing in hot liquid, applying a hot liquid to the second end of the boule, or any other suitable method for heating a boule of semiconductor material relative to an original temperature of the boule. As illustrated, in various system/method implementations, the wafer may be separated from the boule using mechanical methods. Various mechanical methods may include peeling a wafer from a boule, prying a wafer from a boule, twisting a wafer from a boule, or other methods for mechanically separating two pieces of the same material. As illustrated in FIG. 8, the boule may be placed on a stable surface, such as by non-limiting example, a heating chuck 64. The method may include contacting the first end of the boule with a grip 66 and twisting the grip as illustrated by the curved arrows 68. In various implementations, the heating chuck may be applying heat to the second end of the boule while the grip 66 is twisting the first end of the boule. In other implementations, a second grip may be applied to the second end of the boule. The first end of the boule may be twisted in a first direction while the second end of the boule may be twisted in a second direction through the second grip where the second direction is the opposite direction of the first direction. As a result of the mechanical action of the grip(s), substrates/wafers of semiconductor material may then separate from a boule at the damage layer 60 through the combination of thermal forces and mechanical forces.

In the implementation illustrated in FIG. 8, the grip 66 is illustrated has being smaller in diameter than the boule 62. However, in other implementations, the grip may be larger in diameter than the boule. In some implementations, the grip may extend over a portion of the sides of the boule as well, contacting the flats or other structures of the boule as an aid in gripping the boule and/or applying mechanical force to the boule.

In places where the description above refers to particular implementations of optimization of semiconductor substrate production systems and methods and implementing components, sub-components, methods and sub-methods, it should be readily apparent that a number of modifications may be made without departing from the spirit thereof and that these implementations, implementing components, sub-components, methods and sub-methods may be applied to other optimization of semiconductor substrate production systems and methods.

What is claimed is:
1. A method of separating a wafer from a boule comprising a semiconductor material, the method comprising:
   creating a damage layer in a boule comprising semiconductor material, wherein the boule has a first end and a second end; and
   cooling the first end of the boule;

wherein a thermal gradient between the first end and the second end assists a silicon carbide wafer to separate from the boule at the damage layer.

2. The method of claim 1, wherein the damage layer is created through laser irradiation.

3. The method of claim 1, further comprising heating the second end of the boule.

4. The method of claim 3, wherein heating the second end of the boule comprises applying pulses of heat using a heating chuck.

5. The method of claim 1, wherein cooling the first end of the boule further comprises contacting the first end of the boule with liquid nitrogen.

6. The method of claim 1, wherein cooling the first end of the boule further comprises contacting the first end of the boule with liquid nitrogen.

7. The method of claim 3, further comprising placing the second side of the boule on a heating chuck and one of peeling, prying, and twisting the first end of the boule with a grip while applying heat to the second side of the boule.

8. A method of separating a wafer from a boule of silicon carbide, the method comprising:
    creating a damage layer in a boule of silicon carbide, wherein the boule has a first end and a second end;
    applying a material onto the second end of the boule; and
    heating the material at the second end of the boule;
    wherein a thermal gradient caused by heating the second end of the boule assists a silicon carbide wafer to separate from the boule at the damage layer.

9. The method of claim 8, wherein the damage layer is created through laser irradiation.

10. The method of claim 8, wherein the material increases thermal conduction to the second end of the boule.

11. The method of claim 8, further comprising cooling the first end of the boule.

12. The method of claim 8, wherein heating the second end of the boule comprises applying pulses of heat through a heating chuck.

13. The method of claim 8, wherein heating the second end of the boule further comprises applying a hot liquid to the second end of the boule.

14. The method of claim 8, wherein heating the second end of the boule further comprises rapidly immersing the second end of the boule into a hot liquid.

15. The method of claim 8, further comprising placing the second side of the boule on a heating chuck, one of peeling, prying, and twisting the first end of the boule with a grip while applying heat to the second side of the boule.

16. A method of separating a wafer from a boule of silicon carbide, the method comprising:
    cooling or heating an end of a boule;
    creating a damage layer in a boule of silicon carbide, wherein the boule has a first end and a second end;
    creating a thermal gradient between the first end and the second end of the boule; and
    mechanically separating a silicon carbide wafer from the boule at the damage layer.

17. The method of claim 16, wherein the end of the boule is contacted to a heating chuck and heated rapidly.

18. The method of claim 16, wherein heating the end of the boule further comprises applying pulses of heat through a heating chuck.

19. The method of claim 16, wherein heating the end of the boule further comprises applying a hot liquid to the end of the boule.

20. The method of claim 16, wherein heating the end of the boule further comprises immersing the end of the boule into a hot liquid.

* * * * *